(12) United States Patent
Gauthier et al.

(10) Patent No.: US 6,614,287 B1
(45) Date of Patent: Sep. 2, 2003

(54) CALIBRATION TECHNIQUE FOR DELAY LOCKED LOOP LEAKAGE CURRENT

(75) Inventors: Claude R. Gauthier, Fremont, CA (US); Pradeep Trivedi, Sunnyvale, CA (US); Brian W. Amick, Austin, TX (US); Dean Liu, Sunnyvale, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

(21) Appl. No.: 10/217,926

(22) Filed: Aug. 13, 2002

(65) Prior Publication Data (65)

(51) Int. Cl.$^7$ ................................................ H03K 21/00
(52) U.S. Cl. ...................................... 327/362; 327/157
(58) Field of Search ................................. 327/156, 157, 327/158, 362, 558, 536

(56) References Cited

U.S. PATENT DOCUMENTS 6,473,485 B1 * 10/2002 Fernandez-Texon ............ 377/2

FOREIGN PATENT DOCUMENTS

JP 363240215 * 10/1988

* cited by examiner

*Primary Examiner*—Dinh T. Le
(74) *Attorney, Agent, or Firm*—Rosenthal & Osha L.L.P.

(57) ABSTRACT

A method and apparatus for post-fabrication calibration and adjustment of a delay locked loop leakage current is provided. The calibration and adjustment system includes an adjustment circuit that adjusts a leakage current offset circuit to compensate for the leakage current of a capacitor. The capacitor connects to a control voltage of the delay locked loop. Such control of the leakage current in the delay locked loop allows a designer to achieve a desired delay locked loop operating characteristic after the delay locked loop has been fabricated. A representative value of the amount of adjustment desired in the leakage current may be stored and subsequently read to adjust the delay locked loop.

27 Claims, 10 Drawing Sheets

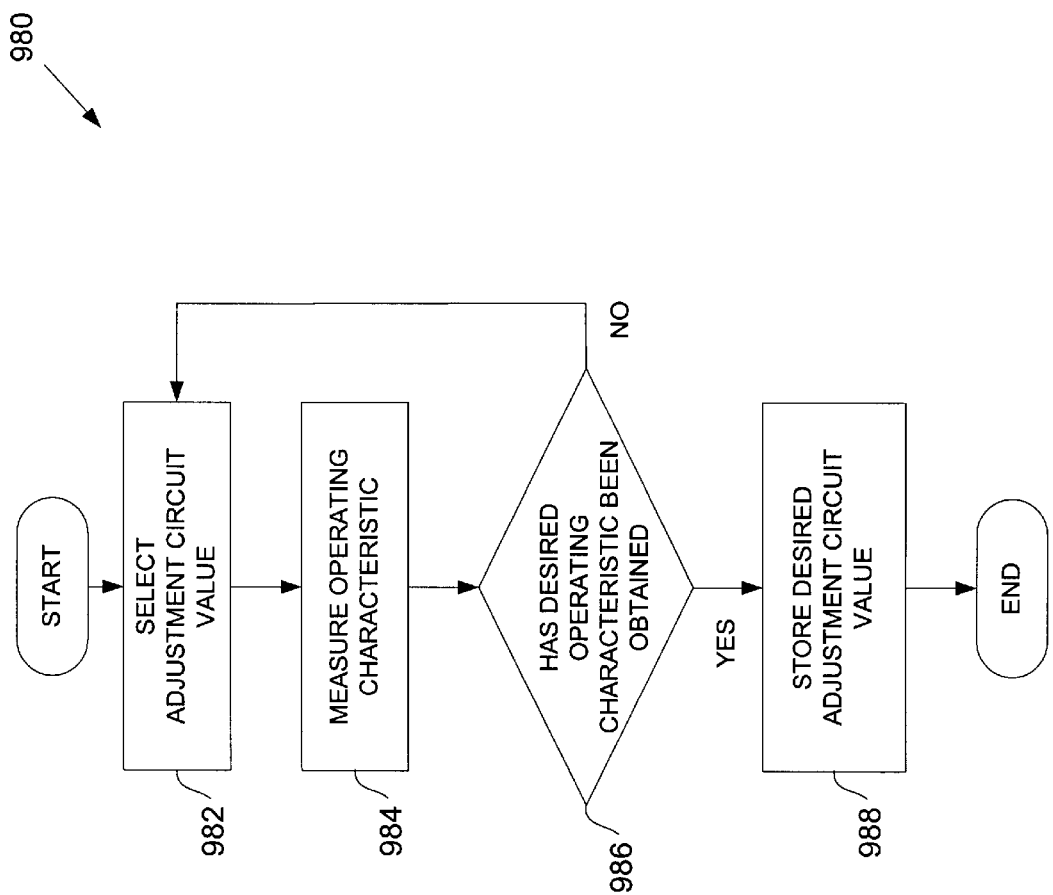

CALIBRATION TECHNIQUE FOR DELAY LOCKED LOOP LEAKAGE CURRENT

BACKGROUND OF INVENTION

As the frequencies of modern computers continue to increase, the need to rapidly transmit data between chip interfaces also increases. To accurately receive data, a clock signal is often sent to help recover the data. The clock signal determines when the data should be sampled or latched by a receiver circuit.

The clock signal may transition at the beginning of the time the data is valid. The receiver circuit, however, may require that the clock signal transition during the middle of the time the data is valid. Also, the transmission of the clock signal may degrade as it travels from its transmission point. In both circumstances, a delay locked loop, or "DLL," can regenerate a copy of the clock signal at a fixed phase shift with respect to the original clock signal.

FIG. 1 shows a section of a typical computer system component (100). Data (14) that is K bits wide is transmitted from circuit A (12) to circuit B (34) (also referred to as the "receiver circuit"). To aid in the recovery of the transmitted data, a clock signal (16) is also transmitted with the data (14). The circuits could also have a path to transmit data from circuit B (34) to circuit A (12) along with an additional clock (not shown). The clock signal (16) may transition from one state to another at the beginning of the data transmission. Circuit B (34) requires a clock signal temporally located some time after the beginning of the valid data. Furthermore, the clock signal (16) may have degraded during transmission. The DLL has the ability to regenerate the clock signal (16) to a valid state and to create a phase shifted version of the clock signal (16) to be used by other circuits. For example, the receiver circuit (34) may use the phase shifted version of the clock signal (16) as the receiver circuit's sampling signal. The receiver circuit's sampling signal determines when the input to the receiver circuit should be sampled. The performance of a DLL is critical, and the DLL must maintain a proper reference of time on the CPU, or generically, an integrated circuit.

FIG. 2 shows a block diagram of a typical DLL (200). Clock signal (201) is input to the DLL (200) to create a phased (i.e., delayed) output. Clock signal (201) is input to a voltage-controlled delay line (210) and to a phase detector (202). The phase detector (202) measures whether a phase difference between the clock signal (201) and an output signal, clk_out (217), of the voltage-controlled delay line (210) has the desired amount of delay. The phase detector (202) produces signals that control a charge pump (204). The phase detector (202) controls the charge pump (204) to increase or decrease its output current using up and down signals, U (203) and D (205). To ensure that the charge pump (204) maintains some nominal current output, the charge pump (204) is internally biased. The internal biasing of the charge pump (204) is dependent on bias signals, $V_{BP}$ (209) and $V_{BN}$ (211), generated from a bias generator (208) (discussed below). The up and down signals (203, 205) adjust the current output of the charge pump (204) with respect to the nominal current set by the bias signals (209, 211).

The charge pump (204) adds or removes charge from a capacitor $C_1$ (206), which in turn, changes a voltage potential at the input of the bias-generator (208). The capacitor (206) is connected between a power supply, $V_{DD}$, and a control signal, $V_{CTRL}$ (207). The bias-generator (208) produces the bias signals (209, 211) in response to the control signal (207), which, in turn, controls the delay of the voltage-controlled delay line (210) and maintains a nominal current output from the charge pump (204).

In FIG. 2, the voltage-controlled delay line (210) may be implemented using current starved elements. This means that the delays are controlled by modifying the amount of current available for charging and discharging capacitances. The linearity of a voltage controlled delay line's characteristics determines the stable range of frequencies over which the DLL (200) can operate. The output signal (217) of the voltage-controlled delay line (210) represents a phase delayed copy of clock signal (201) that is then used by other circuits.

Still referring to FIG. 2, the negative feedback created by the output signal (217) in the DLL (200) adjusts the delay through the voltage-controlled delay line (210). The phase detector (202) integrates the phase error that results between the clock signal (201) and the output signal (217). The voltage-controlled delay line (210) delays the output signal (217) by a fixed amount of time such that a desired delay between the clock signal (201) and the output signal (217) is maintained.

Accordingly, proper operation of the receiver circuit (34 in FIG. 1) depends on the DLL (200) maintaining a constant phase delay between the clock signal (201) and the output signal (217).

SUMMARY OF INVENTION

According to one aspect of the present invention, an integrated circuit comprises a clock path arranged to carry a clock signal; a power supply path arranged to receive power from a power supply; a delay locked loop operatively connected to the power supply path and the clock path comprises a phase detector that detects a phase difference between the clock signal and a delayed clock signal, a charge pump, responsive to the phase detector, that outputs a current on a control signal path, a capacitor, responsive to the current, for storing a voltage potential, and a delay line, operatively connected to the capacitor, that generates the delayed clock signal; a storage device arranged to store control information; and a leakage current offset circuit operatively connected to the capacitor and the storage device where the leakage current offset circuit adjusts the voltage potential dependent on the control information.

According to one aspect of the present invention, a method for post-fabrication treatment of a delay locked loop comprises generating a delayed clock signal; comparing the delayed clock signal to an input clock signal; generating a current dependent on the comparing; storing a voltage potential on a capacitor dependent on the current; selectively adjusting a leakage current of the capacitor using a leakage current offset circuit responsive to an adjustment circuit; and storing control information determined from the selectively adjusting.

According to one aspect of the present invention, an integrated circuit comprises means for generating a delayed clock signal; means for comparing the delayed clock signal and a clock signal; means for generating a current dependent on the means for comparing; means for storing a voltage potential on a capacitor dependent on the means for generating the current; means for selectively adjusting a leakage current of the capacitor; and means for storing control information dependent on the means for selectively adjusting.

Other aspects and advantages of the invention will be apparent from the following description and the appended claims.

BRIEF DESCRIPTION OF DRAWINGS

FIG. 10 shows a flow diagram in accordance with an embodiment of the present invention.

DETAILED DESCRIPTION

Figure 1:
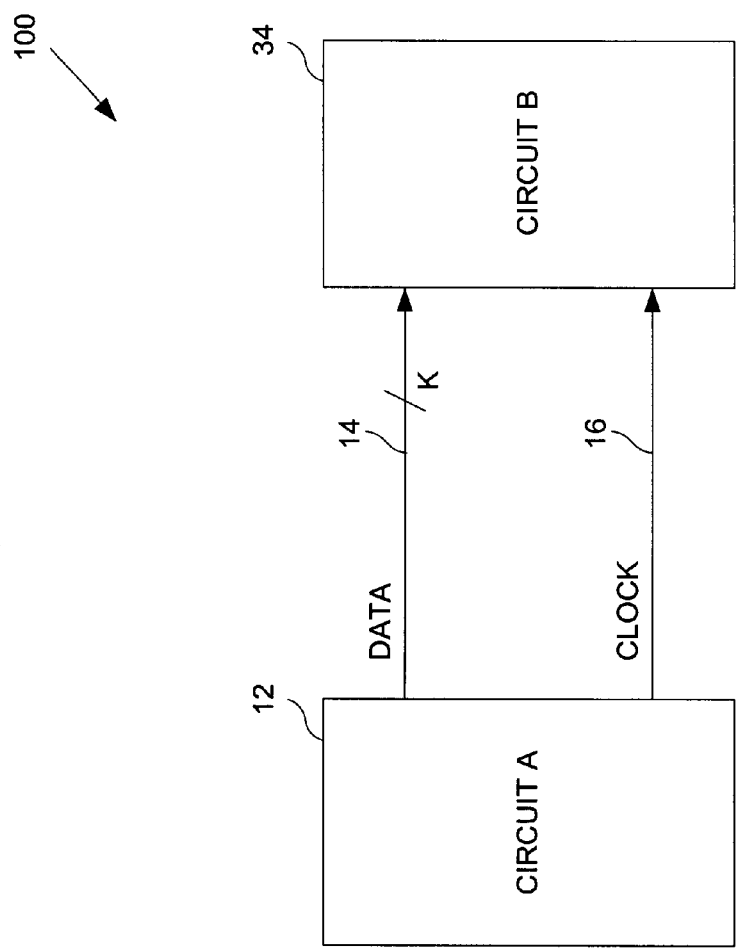
FIG. 1 shows a typical computer system component.

Exemplary embodiments of the invention will be described with reference to the accompanying drawings. Like items in the drawings are shown with the same reference numbers.

Figure 2:
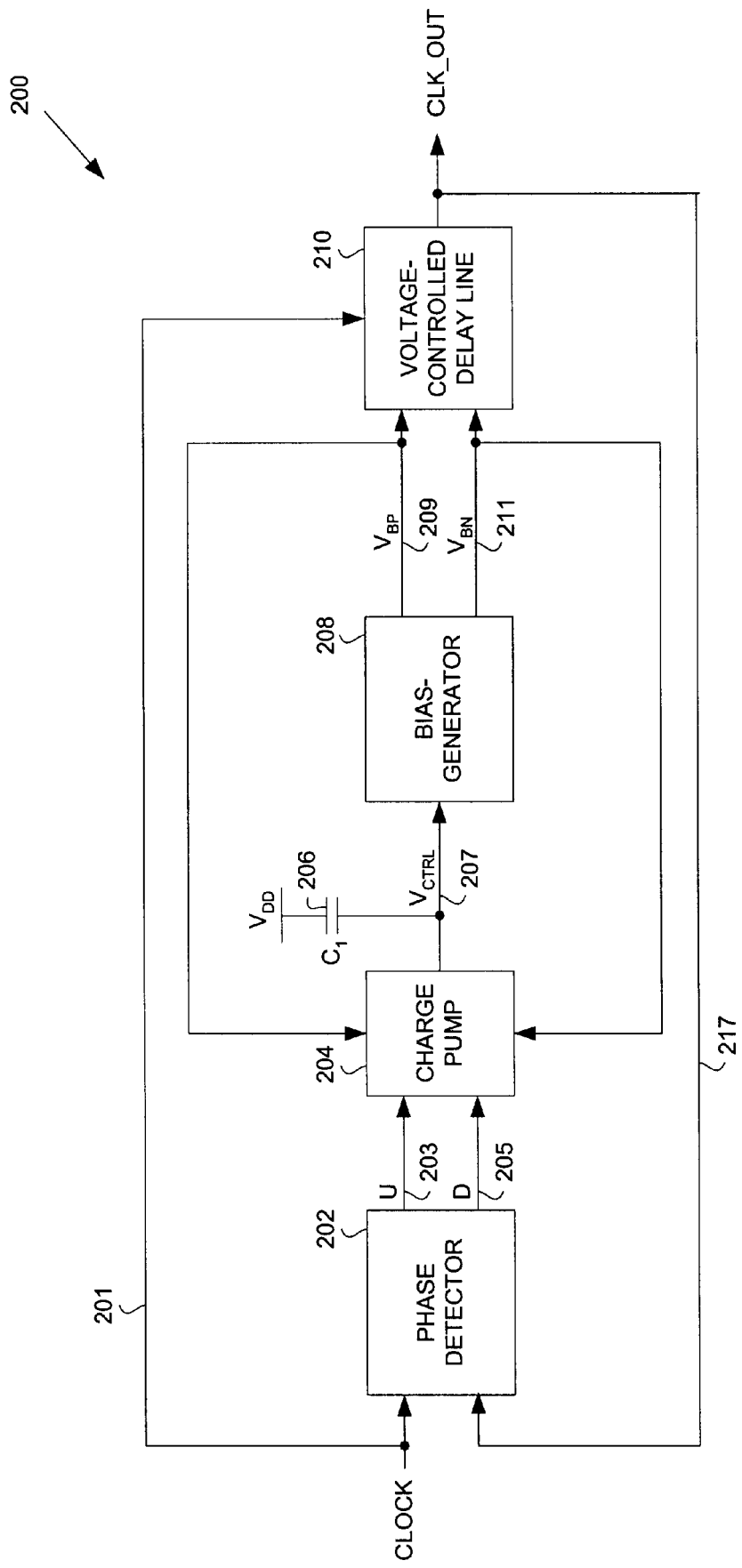
FIG. 2 shows a block diagram of a prior art delay locked loop.

The present invention relates to an adjustment and calibration system for post-fabrication adjustment of a DLL (200 shown in FIG. 2). In FIG. 2, the DLL (200) determines the amount of delay of the voltage-controlled delay line (210) based on a voltage potential maintained by the capacitor (206). Charge may leak from the capacitor (206), which, in turn, changes the stored voltage potential on the capacitor (206). Accordingly, the delay of the voltage-controlled delay line (210) may drift. The adjustment and calibration system includes an adjustment circuit that can compensate for such a leakage current. Thus, the leakage current of the capacitor (206) may be offset so that the capacitor (206) maintains a constant voltage potential. The amount of leakage current offset is stored so that the post-fabrication adjustment of the DLL (200 shown in FIG. 2) is maintained after calibration.

Figure 3:
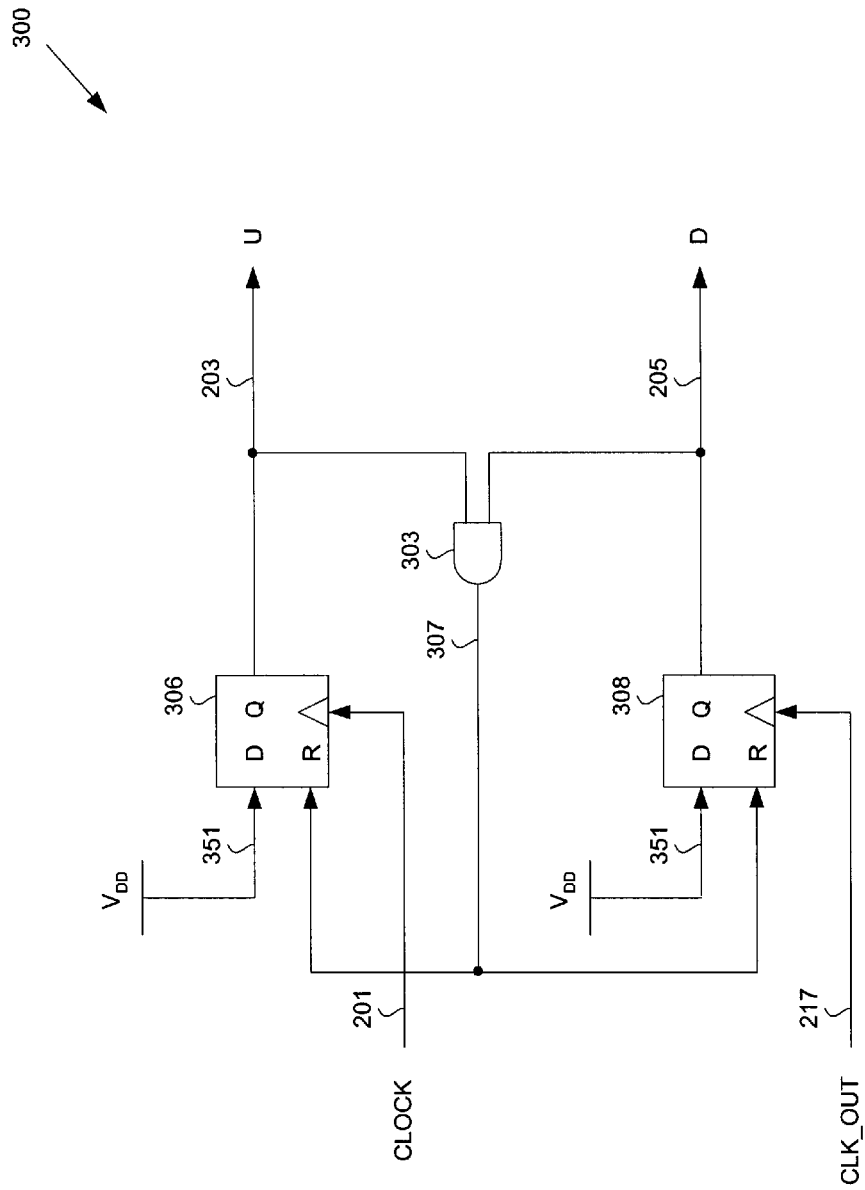
FIG. 3 shows a schematic diagram of a prior art phase detector.

FIG. 3 shows a block diagram of a typical phase detector (300). The phase detector (300) is representative of the phase detector (202) shown in FIG. 2. The phase detector (300) integrates the phase error that results between the clock signal (201) and the output signal (217). The clock signal (201) clocks a flip-flop (306) and the output signal (217) clocks a flip-flop (308).

When clock signal (201) transitions from a low state to a high state, flip-flop (306) transfers the high state created by the power supply $V_{DD}$ (351) on an input of the flip-flop (306) to the up signal (203). When the output signal (217) transitions from a low state to a high state, flip-flop (308) transfers the high state created by the power supply $V_{DD}$ (351) on an input of the flip-flop (308) to the down signal (205). When both the up and down signals (203, 205) are at a high state, the AND gate (303) outputs a high state on signal line (307). The high state on signal line (307) resets both flip-flop (306) and flip-flop (308). The up and down signals (203, 205) transition to a low state when the flip-flop (306) and flip-flop (308) are reset, respectively.

Figure 4:
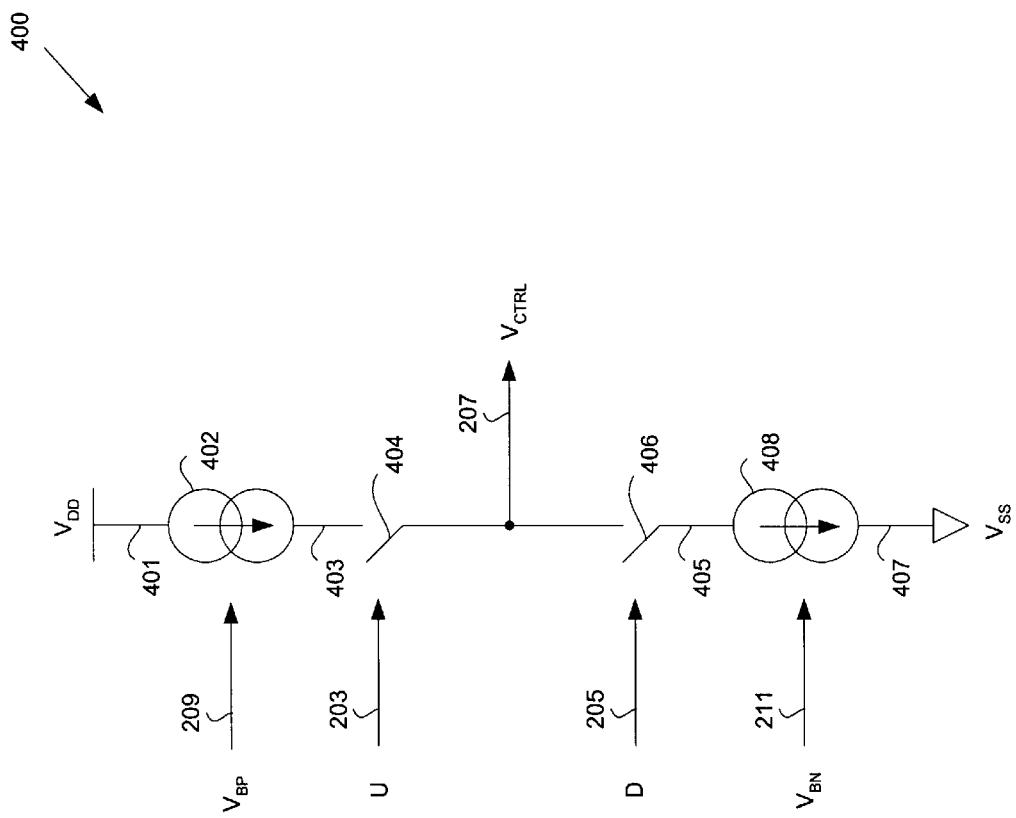
FIG. 4 shows a schematic diagram of a prior art charge pump.

FIG. 4 shows a block diagram of a typical charge pump (400). The charge pump (400) is representative of the charge pump (204) shown in FIG. 2. The charge pump (400) has two current sources (402, 408). The current source (402) provides a current based on the bias signal (209) (also shown in FIG. 2). The current source (408) provides a current based on the bias signal (211) (also shown in FIG. 2). The current source (402) is connected between the power supply $V_{DD}$ (401) and the signal line (403). The current source (408) is connected between the power supply $V_{SS}$ (407) and the signal line (405).

In FIG. 4, the up and down signals (203, 205) from the phase detector (300) shown in FIG. 3 determine whether switches (404, 406) are closed, respectively. When the up signal (203) is at a high state, the switch (404) is closed. The switch (404) is connected between signal (403) and the control signal (207). When closed, the switch (404) allows the current generated by the current source (402) to add charge to the capacitor (206 shown in FIG. 2) using the control signal (207).

When the down signal (205) is at a high state, the switch (406) is closed. The switch (406) is connected between signal (405) and the control signal (207). When closed, the switch (406) allows the current generated by the current source (408) to remove charge from the capacitor (206 shown in FIG. 2) using the control signal (207).

A short time period exists when both the up and down signals (203, 205) are at a high state. In FIG. 3, when both the up and down signals (203, 205) transition to a high state, the AND gate (303) resets the flip-flops (306, 308) by generating a high state on the signal line (307). A finite time duration is needed for the AND gate (303) and the flip-flops (306, 308) to respond to this change in state. In FIG. 4, both the switches (404, 406) are closed when both the up and down signals (203, 205) signals are high. During this time, a nominal amount of charge is added to the capacitor (206 shown in FIG. 2). Some or all of the current generated by the current source (402) is transferred to the $V_{SS}$ power supply (407) through the current source (408).

Figure 5:
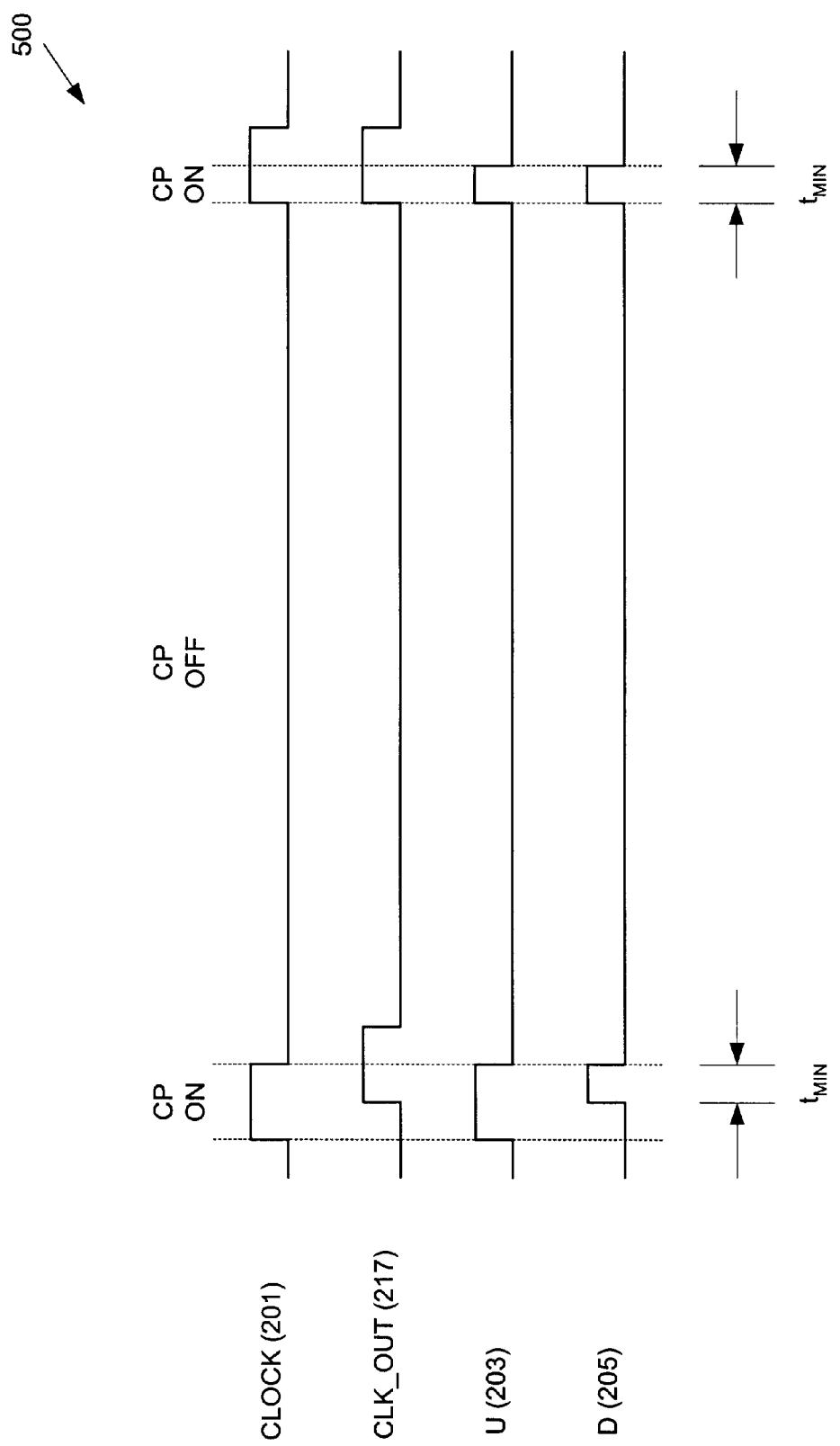
FIG. 5 shows a timing diagram for the phase detector shown in FIG. 3.

FIG. 5 shows a timing diagram (500) for the phase detector (300) shown in FIG. 3. The timing diagram (500) shows two clock cycles. The first clock cycle shows the output signal (217) lagging the clock signal (201) (i.e., they are out of phase). The second cycle shows the output signal (217) properly aligned with the clock signal (201).

In the first cycle, when the clock signal (201) transitions from a low state to a high state, the up signal (203) transitions from a low state to a high state. When the output signal (217) transitions from a low state to a high state, the down signal (205) transitions from a low state to a high state. Because both the up and down signals (203, 205) are at a high state, the AND gate (303 shown in FIG. 3) resets both flip-flops (306, 308 shown in FIG. 3). The up and down signals (203, 205) output a low state when the flip-flops (306, 308 shown in FIG. 3) are reset, respectively.

In the first cycle, the up signal (203) is at a high state for a longer duration than the down signal (205). Accordingly, the current source (402 shown in FIG. 4) adds charge to the capacitor (206 shown in FIG. 2). If the down signal (205) was at a high state for a longer duration than the up signal (203), the current source (408 shown in FIG. 4) would remove charge from the capacitor (206 shown in FIG. 2). The change in the voltage potential maintained by the capacitor (206 shown in FIG. 2) affects the delay of the voltage-controlled delay line (210 shown in FIG. 2).

In FIG. 5, in the second cycle, both the clock signal (201) and the output signal (217) transition from a low state to a high state at the same time. In other words, the clock signal (201) and the output signal (217) are in phase. Accordingly, both the up and down signals (203, 205) transition from a low state to a high state at the same time. Also, both the flip-flops (306, 308 shown in FIG. 3) are reset simultaneously. Because a finite time duration (i.e., $t_{MIN}$) is needed for the AND gate (303 shown in FIG. 3) and the flip-flops (306, 308 shown in FIG. 3) to respond to the change in state, both the up and down signals (203, 205) have a finite time duration for which they are high. A nominal amount of charge is added to the capacitor (206 shown in FIG. 2) to maintain the present voltage potential on the control signal (207 shown in FIG. 2).

In FIG. 5, the times during which the charge pump (400 shown in FIG. 4) may modify or maintain the charge on the capacitor (206 shown in FIG. 2) are indicated. When the clock signal (201) and the output signal (217) are aligned, the time duration that the charge pump (400 shown in FIG. 4) is active is relatively small (i.e., $t_{MIN}$). During the time the charge pump (400 shown in FIG. 4) is inactive (i.e., when both switches (404, 406) are open), the voltage potential on the capacitor (206 shown in FIG. 2) may drift due to leakage currents inherent with devices used to form the capacitor (206 shown in FIG. 2). A means to compensate for the drift and store the amount of compensation is needed.

Semiconductor capacitors are typically parallel plate capacitors formed by connecting the source and drain of a transistor together to create one terminal of the capacitor. The other terminal of the capacitor is formed by the gate connection of the transistor. Tunneling through the gate creates a path for leakage current. Leakage current causes the voltage potential originally stored on the capacitor to change. In a DLL, the capacitor (e.g., 206 shown in FIG. 2) helps maintain the amount of delay produced by the voltage-controlled delay line (210 shown in FIG. 2).

In FIG. 2, the relatively long time durations between the charge pump (204) updating the charge stored (i.e., voltage potential stored) on the capacitor (206) may result in a drift in the expected amount of delay of the DLL (200). Although a designer may intend for an integrated circuit to have a particular value for the leakage current of the capacitor (206), actual values for these parameters are typically unknown until the integrated circuit has been fabricated (i.e., in a post-fabrication stage).

For example, a designer may intend for the delay drift of the DLL (200) to be within in a particular range. The leakage current of the capacitor (206) may be unintentionally affected by many factors in the fabrication process. Because the leakage current cannot be redesigned in the post-fabrication stage without considerable temporal and monetary expenditures, these fabrication factors may cause the DLL (200) to have a different delay drift range than the range it was designed to have and therefore may have poor performance. Accordingly, there is a need for a technique and design that facilitates increased post-fabrication control of leakage current in the capacitor (206) of the DLL (200). The amount of leakage current offset is stored so that the post-fabrication adjustment of the DLL (200) is maintained after calibration.

Figure 6:
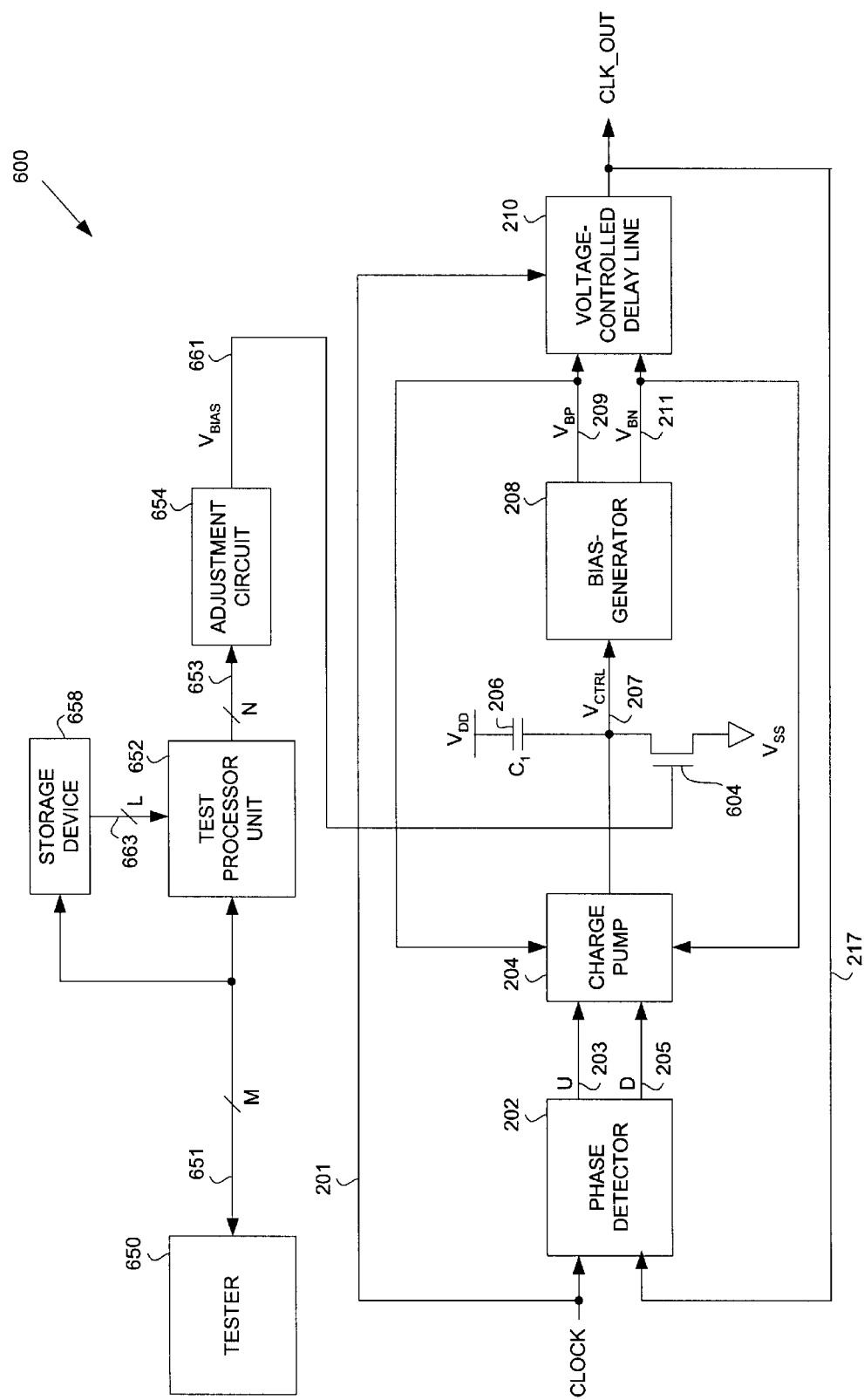
FIG. 6 shows a block diagram of a delay locked loop with an adjustable leakage current offset circuit and a storage device in accordance with an embodiment of the present invention.

FIG. 6 shows an exemplary adjustable DLL (600) in accordance with an embodiment of the present invention. The phase detector (202), capacitor (206), bias-generator (208) and voltage-controlled delay line (210) of the adjustable DLL (600) operate similar to those respective components described above with reference to FIG. 2.

In FIG. 6, a leakage current offset circuit (604) is connected between the control signal (207) and a power supply $V_{SS}$. As the capacitor (206) leaks current, the voltage potential on the control signal (207) has a tendency to drift toward the power supply $V_{DD}$. The leakage current offset circuit (604) is arranged to pull the voltage potential on the control signal (207) toward a power supply $V_{SS}$. For example, an n-channel transistor is used as the leakage current offset circuit (604).

One of ordinary skill in the art will appreciate that in other embodiments, the capacitor (206) may be connected between the control signal (207) and the power supply $V_{SS}$. In this case, the leakage current offset circuit (604) is connected between the control signal (207) and the power supply $V_{DD}$. A leakage current offset circuit (604) in this arrangement may be a p-channel transistor.

In FIG. 6, an adjustment circuit (654) is used to adjust the leakage current offset circuit (604) to compensate for the leakage current of the capacitor (206). A bias voltage potential, $V_{BIAS}$ (661), is used to control the amount of compensation applied to offset the leakage current. The bias voltage potential (661) may be adjusted to increase, decrease, turn off, or maintain the amount of leakage current compensation (i.e., leakage current offset) produced by the leakage current offset circuit (604).

In FIG. 6, a test processor unit (652) controls the adjustment circuit (654) using multiple adjustment signals N (653). The values of the multiple adjustment signals N (653) are determined by the test processor unit (652). The test processor unit (652) may communicate through a host interface (not shown) using M communication lines (651). Those with ordinary skill in the art will appreciate that the host interface and M communication lines (651) may take a wide variety of forms. The communication may be defined by an industry standard.

The host interface (not shown) may be used to operatively connect to a separate computer system. For example, a tester (650) may communicate with the test processor unit (652). In some embodiments, the tester (650) may instruct the test processor unit (652) to adjust adjustment circuit (654) to modify the offset of a leakage current of the adjustable DLL (600). In some embodiments, the tester (650) may measure an operating characteristic of the adjustable DLL (600) or a representative operating characteristic of an integrated circuit on which the adjustable DLL (600) resides to determine the effect of the adjustment. A variety of different adjustments may be made in an effort to identify the adjustment settings that produce the desired operating characteristics of the adjustable DLL (600).

For example, the tester (650) may be used to adjust the adjustable DLL (600) until the delay drift in the voltage-controlled delay line (210) is minimized. The tester (650) may also be used to adjust the adjustable DLL (600) until the operating characteristics of the adjustable DLL (600) reaches a desired performance level. The operating characteristics may include delay drift, maximum operating frequency, minimum operating frequency, lock time, etc.

A storage device (658) may be designed to store control information representative of the adjustment settings that produce the desired operating characteristics of the adjustable DLL (600). By using the tester (650), control information may be written into the storage device (658). The tester (650) may read or rewrite the control information in the storage device (658).

The storage device (658) may include multiple storage elements such that the control information may be represented by a binary word. For example, the control information stored in the storage device (658) may be a binary word that matches the values of the multiple adjustment signals N (653). Alternatively, the control information may be a binary encoded word. For example, if the multiple adjustment signals N (653) used eight adjustment signals, the control information might be represented with a three bit binary word. Alternatively, the control information may contain instructions, interpreted by the test processor unit (652), to control the multiple adjustment signals N (653).

In FIG. 6, the tester (650) may be removed from the adjustable DLL (600). The test processor unit (652) may read the storage device (658) to obtain the control information and determine the amount of adjustment that should occur in the adjustment circuit (654). The adjustable DLL (600), after the test processor unit (652) reads the control information in the storage device (658) and adjusts the adjustment circuit (654), may have an operating characteristic similar to the operating characteristics obtained while connected to the tester (650). The test processor unit (652) reads the control information from storage device (658) using the L signal lines (663).

Those skilled in the art will appreciate that the adjustable DLL (600) may be analog, digital, or a combination of both types of circuits.

Figure 7:
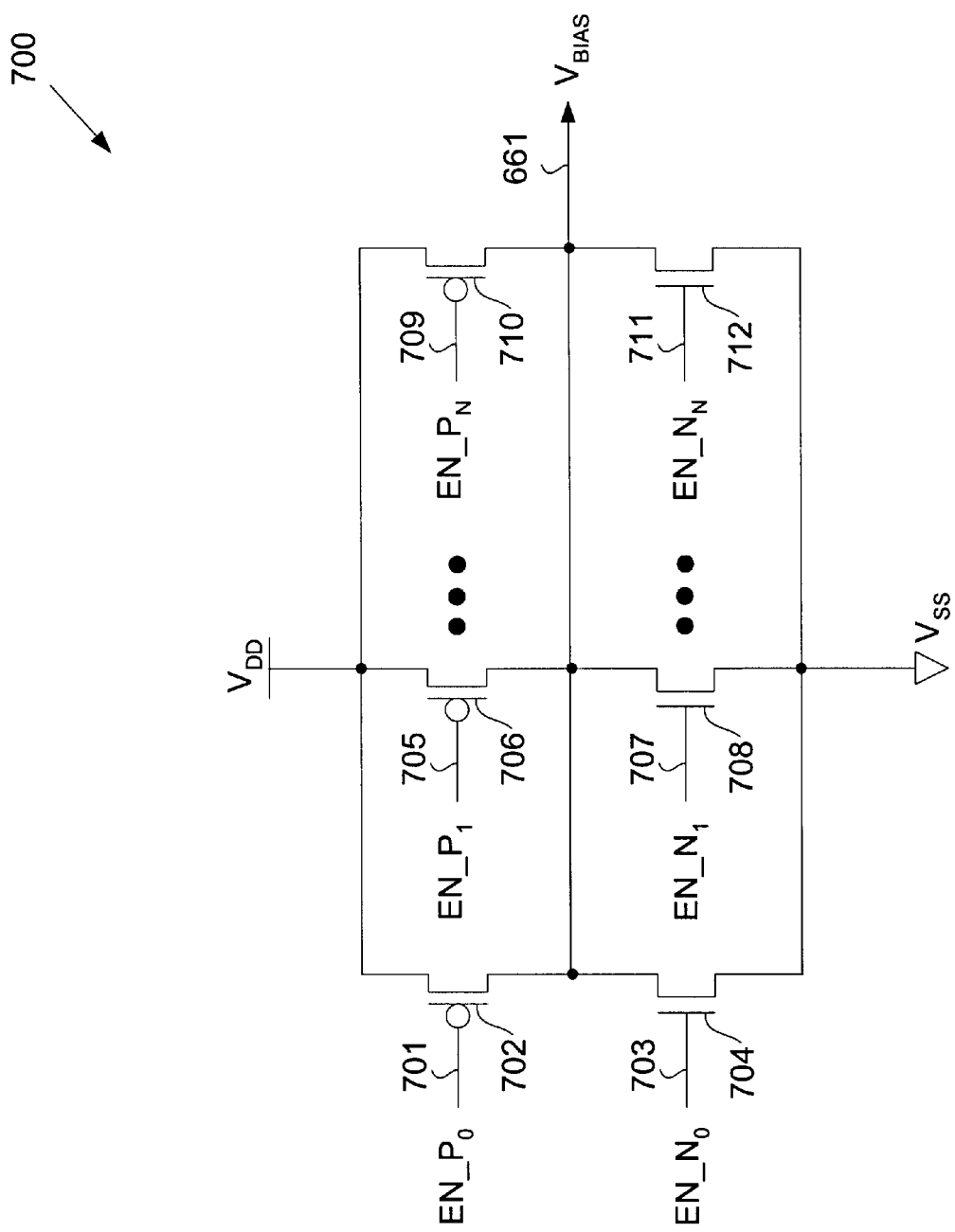
FIG. 7 shows a schematic diagram of an adjustment circuit in accordance with an embodiment of the present invention.

FIG. 7 shows an exemplary adjustment circuit (700) in accordance with an embodiment of the present invention. The adjustment circuit (700) includes multiple p-channel transistors (702, 706, 710) arranged in parallel with each other. The multiple p-channel transistors (702, 706, 710) connect between the power supply $V_{DD}$ and a common node on which a bias voltage potential, $V_{BIAS}$ (661), is supplied to the leakage current offset circuit (604 shown in FIG. 6). The adjustment circuit (700) also includes multiple n-channel transistors (704, 708, 712) arranged in parallel with each other. The multiple n-channel transistors (704, 708, 712) connect between power supply $V_{SS}$ and the common node (661).

Each transistor has an individual control signal that turns "on" or "off" the respective p-channel transistors (702, 706, 710) and respective n-channel transistors (704, 708, 712). The p-channel transistors (702, 706, 710) have control signals EN_$P_0$ (701), EN_$P_1$ (705), and EN_$P_N$ (709) connected to their gates, respectively. The n-channel transistors (704, 708, 712) have control signals EN_$N_0$ (703), EN_$N_1$ (707), and EN_$N_N$ (711) connected to their gates, respectively. A "low" voltage potential on any of the EN_$P_X$ control signals (701, 705, 709), where "x" represents any index 0 through N, turns "on" the respective p-channel transistor (702, 706, 710). A "high" voltage potential on any of the EN_$N_X$ control signals (703, 707, 711), where "x" represents any index 0 through N, turns "on" the respective n-channel transistor (704, 708, 712).

A p-channel transistor (702, 706, 710) that is "on" changes the bias voltage potential (661) toward power supply $V_{DD}$. An n-channel transistor (704, 708, 712) that is "on" changes the bias voltage potential (661) toward power supply $V_{SS}$. By selecting which p-channel transistors (702, 706, 710) and/or n-channel transistors (704, 708, 712) are "on," a selected change in the bias voltage potential (661) may be achieved.

Those with ordinary skill in the art will appreciate that the p-channel transistors (702, 706, 710) and n-channel transistors (704, 708, 712) may be turned "on" individually or as a group. The p-channel transistors (702, 706, 710) and n-channel transistors (704, 708, 712) may be sized so that each transistor has a different effect compared to the other transistors. For example, a transistor's gate width may be varied to adjust the strength of each transistor. The gate widths of the p-channel transistors (702, 706, 710) and n-channel transistors (704, 708, 712) may be designed to provide a linear, exponential, or other function as more transistors are turned "on." In some embodiments, the p-channel transistors (702, 706, 710) and n-channel transistors (704, 708, 712) may be sized so that each transistor has a different resistance. For example, transistor gate lengths may be increased (i.e., long channel transistors) to increase the inherent resistance of each transistor. A larger inherent resistance may be advantageous if both a p-channel transistor and a n-channel transistor are "on" simultaneously. In one or more embodiments, the adjustment circuit (700) may include only one p-channel transistor (e.g., p-channel transistor (702)) and one n-channel transistor (e.g., n-channel transistor (704)) connected in series.

The adjustment circuit (700) in FIG. 7 may be used as the adjustment circuit (654) shown in FIG. 6. In FIG. 6, the test processor unit (652) generates a binary control word that determines which n-channel transistors (704, 708, 712 shown in FIG. 7) and p-channel transistors (702, 706, 710 shown in FIG. 7) are "on" and which are "off" in the adjustment circuit (654). Depending on the binary control word maintained by the test processor unit (652), multiple adjustment signals N (653) that represent EN_$N_X$ signals (703, 707, 711 in FIG. 7) and EN_$P_X$ signals (701, 705, 709 in FIG. 7) may turn "on" or turn "off" the p-channel transistors (702, 706, 710 shown in FIG. 7) and n-channel transistors (704, 708, 712 shown in FIG. 7) in the adjustment circuit (654). The common node (661) of the adjustment circuit (654) adjusts the leakage current offset circuit (604).

Figure 8:
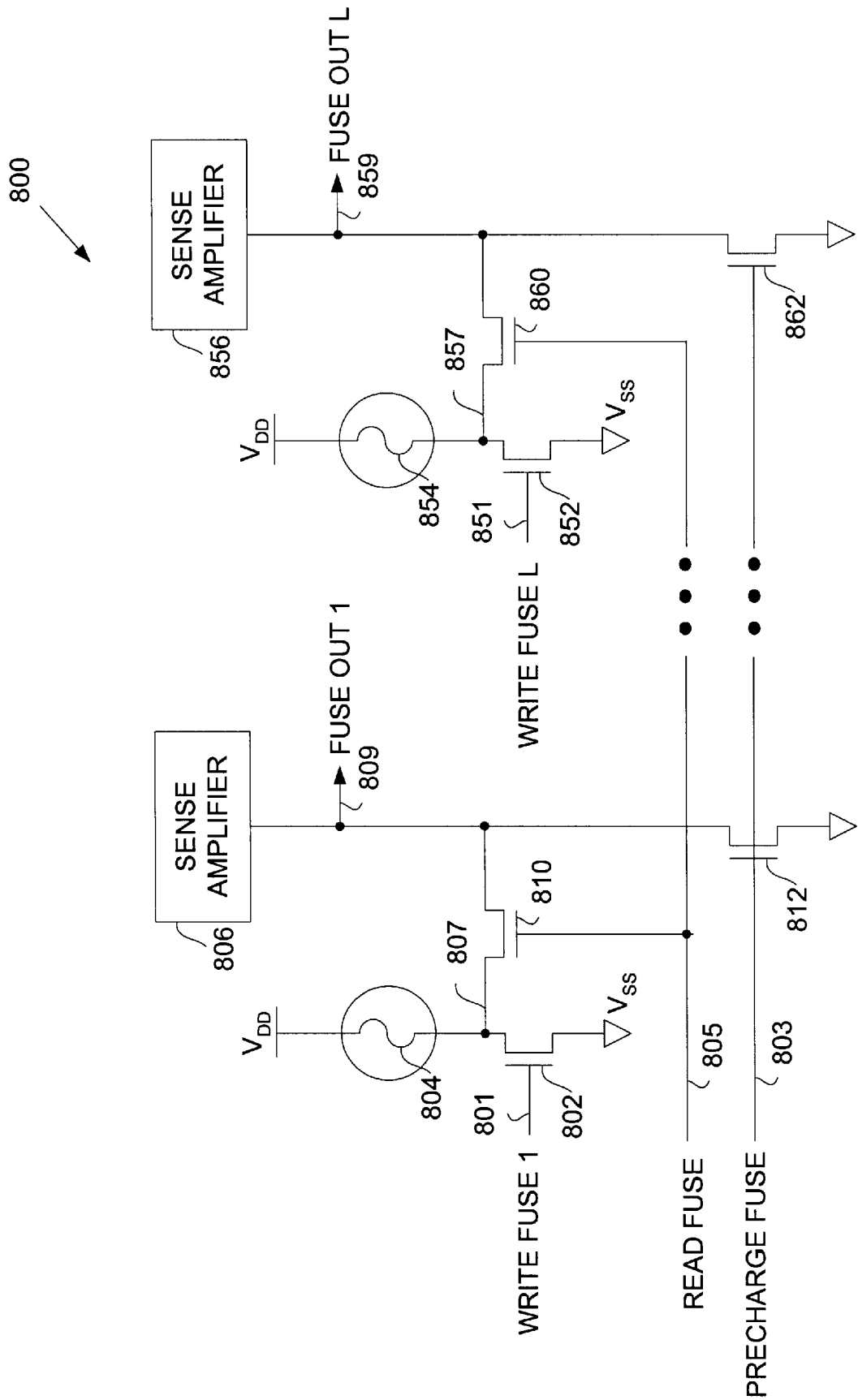
FIG. 8 shows a schematic diagram of a storage device in accordance with an embodiment of the present invention.

FIG. 8 shows an exemplary storage device (800) in accordance with an a embodiment of the present invention. The storage device (800) may be used for the storage device (658 shown in FIG. 6). The storage device (800) includes electrically programmable fuses (804, 854) to store nonvolatile control information.

In FIG. 8, multiple write signals such as write fuse 1 signal (801) through write fuse L signal (851) are used to program electrically programmable fuses (804, 854), respectively. A "high" voltage potential on the write fuse 1 signal (801) and write fuse L signal (851) causes n-channel transistors (802, 852) to turn "on," respectively. If n-channel transistors (802, 852) are "on" for a sufficient duration, the fuse (804) and fuse (854), respectively, create an "open" circuit. A precharge fuse signal (803) will pulse a "high" voltage potential on the gates of n-channel transistors (812, 862) to momentarily turn them "on." If n-channel transistors (812, 862) are "on," fuse out 1 signal (809) and fuse out L signal (859) will be pulled to a "low" voltage potential by n-channel transistors (812, 862). The "low" voltage potential on the fuse out 1 signal (809) and the fuse out L (859) will precharge the fuse out 1 signal(809) and the fuse out L signal (859) in anticipation of a read operation.

In FIG. 8, a "high" voltage potential on a read fuse signal (805) causes n-channel transistors (810, 860) to turn "on." If any of the fuses (804, 854) are intact (i.e., shorted), the fuse out 1 signal (809) and the fuse out L signal (859) are pulled to a "high" voltage potential. If any of the fuses (804, 854) are open, the fuse out 1 signal (809) and the fuse out L signal (859) remain at a "low" voltage potential. Sense amplifiers (806, 856) sense the voltage potential levels on the fuse out 1 signal (809) and the fuse out L signal (859), respectively, to amplify and maintain the voltage potential levels.

Figure 9:
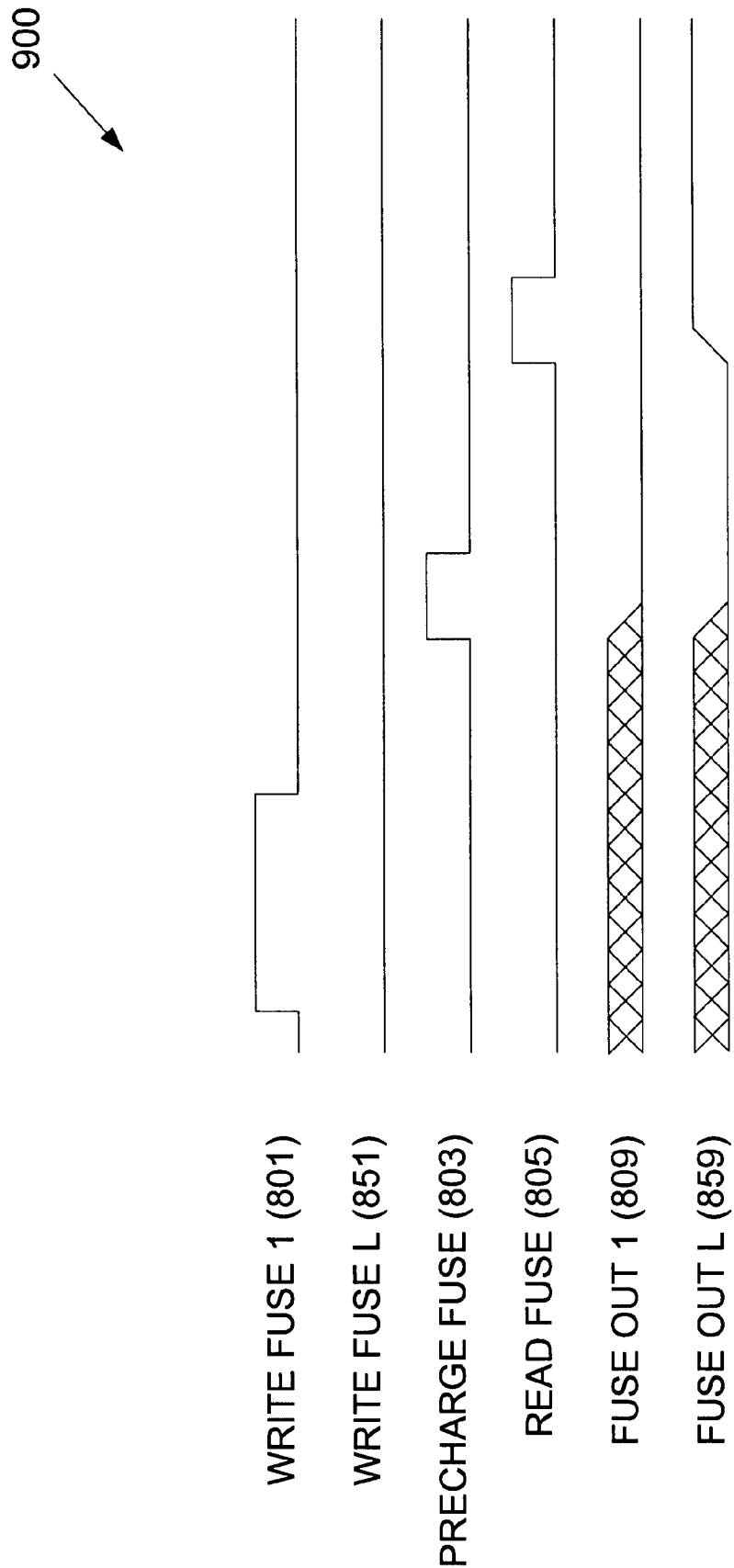
FIG. 9 shows a timing diagram for the storage device shown in FIG. 8.

FIG. 9 shows a timing diagram (900) related to the programming of the storage device (800 shown in FIG. 8) in accordance with an embodiment of the present invention. In this example, the write fuse 1 signal (801) is pulsed to a "high" voltage potential to create an "open" on fuse (804). The write fuse L signal (851) remains at a "low" voltage potential to leave fuse (804) intact. Precharge fuse signal (803) signal pulses a "high" voltage potential to pull the fuse out 1 signal (809) and fuse out L signal (859) to a "low" voltage potential. The read fuse signal (805) pulses a "high" voltage potential to read the state of the fuses (804, 854). Because fuse (804) is "open," the fuse out 1 signal (809) remains at a "low" voltage potential. Because fuse (854) is intact or "shorted," the fuse out L signal (859) is pulled to a "high" voltage potential.

Because the fuses (804, 854) have been programmed and read, the fuse out 1 signal (809) and the fuse out L signal (859) maintain the programmed control information. The state of the fuses (804, 854) may be read at any time by observing the voltage potential level on the fuse out 1 signal (809) and the fuse out L signal (859). Also, the state of the fuses (804, 854) may be read by repeating the precharge and read cycles. Using multiple fuses and related circuitry, a binary word may represent the stored control information.

One of ordinary skill in the art will appreciate that the electrically programmable fuses are but one method to store information. In other embodiments, the storage device (658 in FIG. 6) may contain a wide variety of types of storage elements including, but not limited to, an electrically programmable fuse, an electrically programmable read only memory, an electrically erasable read only memory, a one time programmable memory, a flash memory, a laser programmable fuse, and a laser programmable anti-fuse.

FIG. 10 shows a flow diagram in accordance with an embodiment of the present invention. At (982), an adjustment circuit value is selected. The selected adjustment value may be used to adjust adjustment circuit (654 shown in FIG. 6). The adjustment circuit (654 shown in FIG. 6) may create a bias voltage potential (661 shown in FIG. 6) to adjust the leakage current offset circuit (604 shown in FIG. 6). The adjustment of the leakage current offset modifies an operating characteristic of the adjustable DLL (600 in FIG. 6). For example, the delay drift of the adjustable DLL (600 in FIG. 6) may be measured. Also, the performance of other circuits that rely on the adjustable DLL (600 in FIG. 6) may be measured. At (984), the operating characteristics are measured.

At (986) a determination as to whether a desired operating characteristic(s) is obtained. The determination may be based on an operating characteristic(s) taken with the selected adjustment circuit value, or an interpolation or extrapolation from data obtained from selectively adjusting the adjustment circuit value. If the desired operating characteristic(s) has not been obtained, (982) and (984) are repeated until a desired operating characteristic(s) has been obtained. If the desired operating characteristic(s) has been obtained, the adjustment circuit value, or a representation of the value, is stored at (988). The desired adjustment circuit value or representation of the value is stored as control information in the storage device (658 in FIG. 6). The storage device (658 in FIG. 6) may contain control information that may be accessed and used to improve the performance of the adjustable DLL (600 in FIG. 6) after fabrication.

Advantages of the present invention may include one or more of the following. The adjustable DLL (600 in FIG. 6), having been fabricated, may demonstrate operating characteristics that may not have been apparent from simulation. In some embodiments, because the adjustment circuit (654 shown in FIG. 6) may modify the operating characteristics of the adjustable DLL (600 in FIG. 6), the adjustable DLL (600 in FIG. 6) may be calibrated.

In some embodiments, because the adjustable DLL (600 in FIG. 6) may be fabricated with a means for adjusting the leakage current offset, fewer design iterations and higher confidence in the adjustable DLL (600 in FIG. 6) operating characteristics may be afforded.

In some embodiments, the tester (650 shown in FIG. 6) and test processor unit (652 shown in FIG. 6) may communicate so that the state of the adjustable DLL (600 in FIG. 6) may be obtained, performance characteristics analyzed, and/or adjustments made to the adjustable DLL (600 shown in FIG. 6). By using the tester (650 shown in FIG. 6), control information may be stored in a storage device (658 shown in FIG. 6).

In some embodiments, the tester (650 shown in FIG. 6) may take a relatively long time to determine the desired value and program the control information. Because the control information is programmed, the adjustable DLL (600 in FIG. 6) and the integrated circuit on which it resides may quickly (for example, within a few nanoseconds) adjust the adjustable DLL (600 in FIG. 6) to obtain proper operation.

In some embodiments, a limited number of adjustable DLLs (600 in FIG. 6) may need to be tested to determine the desired value for the control information for a larger number of adjustable DLLs (600 in FIG. 6).

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. An integrated circuit, comprising:
   a clock path arranged to carry a clock signal;
   a power supply path arranged to receive power from a power supply;
   a delay locked loop operatively connected to the power supply path and the clock path, comprising:
      a phase detector that detects a phase difference between the clock signal and a delayed clock signal,
      a charge pump, responsive to the phase detector, that outputs a current on a control signal path,
      a capacitor, responsive to the current, for storing a voltage potential, and
      a delay line, operatively connected to the capacitor, that generates the delayed clock signal;
   a storage device arranged to store control information; and
   a leakage current offset circuit operatively connected to the capacitor and the storage device, wherein the leakage current offset circuit adjusts the voltage potential dependent on the control information.

2. The integrated circuit of claim 1, further comprising:
   an adjustment circuit comprising:
      a first switch that controls current flow between a first voltage potential and an output of the adjustment circuit; and
      a second switch that controls current flow between a second voltage potential and the output of the adjustment circuit, wherein the output is operatively connected to the leakage current offset circuit.

3. The integrated circuit of claim 2, wherein the leakage current offset circuit comprises a transistor, and wherein the adjustment circuit is operatively connected to a gate of the transistor.

4. The integrated circuit of claim 2, wherein the first switch comprises a first p-channel transistor and the second switch comprises a first n-channel transistor connected in series.

5. The integrated circuit of claim 4, the adjustment circuit further comprising:
   a second p-channel transistor connected in parallel with the first p-channel transistor; and
   a second n-channel transistor connected in parallel with the first n-channel transistor, wherein the first p-channel transistor and second p-channel transistor are in series with the first n-channel transistor and second n-channel transistor.

6. The integrated circuit of claim 2, further comprising:
   a test processor unit operatively connected to the storage device and the adjustment circuit.

7. The integrated circuit of claim 6, further comprising:
   a tester arranged to communicate with the test processor unit and read at least a portion of the control information in the storage device.

8. The integrated circuit of claim 6, further comprising:
   a tester arranged to communicate with the test processor unit and write at least a portion of the control information in the storage device.

9. The integrated circuit of claim 6, further comprising:
   a service processor arranged to communicate with the test processor unit and read at least a portion of the control information in the storage device.

10. The integrated circuit of claim 6, further comprising:
    a service processor arranged to communicate with the test processor unit and write at least a portion of the control information in the storage device.

11. The integrated circuit of claim 1, wherein the storage device comprises a storage element selected from a group consisting of an electrically programmed fuse, an electrically programmed read only memory, an electrically erasable read only memory, a one time programmable memory, and a flash memory.

12. The integrated circuit of claim 1, wherein the storage device comprises a storage element selected from a group consisting of a laser programmable fuse and a laser programmable anti-fuse.

13. The integrated circuit of claim 1, wherein the control information comprises a binary word.

14. The integrated circuit of claim 1, wherein the control information comprises an instruction.

15. A method for post-fabrication treatment of a delay locked loop, comprising:
    generating a delayed clock signal;
    comparing the delayed clock signal to an input clock signal;
    generating a current dependent on the comparing;
    storing a charge on a capacitor dependent on the current;
    selectively adjusting a leakage current of the capacitor using a leakage current offset circuit responsive to an adjustment circuit, wherein the selectively adjusting the leakage current comprises:
      controlling a first current flow between a first voltage potential and an output of the adjustment circuit, and
      controlling a second current flow between a second voltage potential and the output of the adjustment circuit; and
    storing control information representative of adjustment settings resulting from the selectively adjusting.

16. The method of claim 15, wherein the selectively adjusting uses the adjustment circuit to operatively control a gate of a transistor in the leakage current offset circuit.

17. The method of claim 15, wherein the adjustment circuit comprises a first p-channel transistor and a first n-channel transistor connected in series.

18. The method of claim 17, the adjustment circuit further comprising:
    a second p-channel transistor connected in parallel with the first p-channel transistor; and
    a second n-channel transistor connected in parallel with the first n-channel transistor, wherein the first p-channel transistor and second p-channel transistor are in series with the first n-channel transistor and second n-channel transistor.

19. The method of claim 15, wherein the storing the control information comprises using at least one selected from a group consisting of electrically programming a fuse, electrically programming a read only memory, electrically erasing a read only memory, programming a one time programmable memory, and programming a flash memory.

20. The method of claim 15, wherein the storing the control information comprises using at least one selected from a group consisting of laser programming a fuse and laser programming an anti-fuse.

21. The method of claim 15, further comprising:
    reading the control information using a test processor unit; and
    operatively controlling the selectively adjusting of the leakage current with the test processor unit.

22. The method of claim 15, further comprising:
    reading the control information using a tester; and
    controlling a test processor unit to adjust the leakage current using the adjustment circuit.

23. The method of claim 15, further comprising:
    writing the control information using a tester.

24. The method of claim 15, further comprising:
    reading the control information using a service processor.

25. The method of claim 15, wherein the control information represents an offset in the leakage current.

26. The method of claim 15, wherein the leakage current offset circuit comprises a transistor.

27. An integrated circuit, comprising:
    means for generating a delayed clock signal;
    means for comparing the delayed clock signal and a clock signal;
    means for generating a current dependent on the means for comparing;
    means for storing a charge dependent on the current;
    means for selectively adjusting a leakage current of the means for storing, wherein the means for selectively adjusting comprises:
      means for controlling a first current flow between a first voltage potential and an output of the means for selectively adjusting, and
      means for controlling a second current flow between a second voltage potential and the output of the means for selectively adjusting; and
    means for storing control information representative of adjustment settings established by the means for selectively adjusting.

* * * * *